(12) United States Patent
Kwak

(10) Patent No.: US 7,501,679 B2
(45) Date of Patent: Mar. 10, 2009

(54) FLASH MEMORY DEVICE AND METHOD FOR FABRICATING THE SAME

(75) Inventor: Sung Ho Kwak, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/652,682

(22) Filed: Jan. 12, 2007

(65) Prior Publication Data

US 2007/0117320 A1     May 24, 2007

Related U.S. Application Data

(62) Division of application No. 11/320,741, filed on Dec. 30, 2005, now Pat. No. 7,199,034.

(30) Foreign Application Priority Data

Nov. 4, 2005 (KR) .......................... 2005-0105433

(51) Int. Cl.
*H01L 29/788* (2006.01)
(52) U.S. Cl. ............................... 257/316; 257/E21.179
(58) Field of Classification Search ......... 257/316–321; 438/257–267
See application file for complete search history.

(56) References Cited

U.S. PATENT DOCUMENTS

| | | | |
|---|---|---|---|
| 5,633,184 A * | 5/1997 | Tamura et al. ............... 438/264 |
| 6,136,653 A * | 10/2000 | Sung et al. ................... 438/266 |
| 6,242,308 B1 * | 6/2001 | Hsieh et al. .................. 438/265 |
| 6,770,520 B2 | 8/2004 | Chuang et al. | |
| 6,881,629 B2 | 4/2005 | Hsieh et al. | |
| 6,995,080 B2 | 2/2006 | Scott | |
| 7,118,969 B2 * | 10/2006 | Chung et al. ................ 438/265 |
| 7,189,618 B2 * | 3/2007 | Lee .............................. 438/260 |
| 2001/0015454 A1 | 8/2001 | Lee et al. | |
| 2002/0132421 A1 * | 9/2002 | Furuhata ..................... 438/257 |
| 2006/0110882 A1 | 5/2006 | Liu et al. | |

* cited by examiner

*Primary Examiner*—Richard A. Booth
(74) *Attorney, Agent, or Firm*—McKenna Long & Aldridge, LLP

(57) ABSTRACT

A flash memory device includes a floating gate formed with a byproduct, such as a polymer, generated in an etching process. The flash memory device is configured to minimize the unstableness often caused by a floating gate that includes direct contact between polymer and polysilicon. Formation of the floating gate includes forming a tunneling oxide layer, a conductive layer and an insulating layer on a semiconductor substrate. Portions of the insulating layer are removed using a photoresist pattern defining a floating gate area as a mask. Thermal oxide layers are formed on a surface of the conductive layer from which the insulating layer was removed. Polymer materials are included on sides of the respective photoresist pattern and insulating layer. A floating gate is formed by selectively removing portions of the thermal oxide layer and the conductive layer using the photoresist and the polymer materials as a mask.

2 Claims, 6 Drawing Sheets

FLASH MEMORY DEVICE AND METHOD FOR FABRICATING THE SAME

This application is a Divisional of application Ser. No. 11/320,741 filed Dec. 30, 2005 now U.S. Pat. No. 7,199,034, which is hereby incorporated by reference as if fully set forth herein.

This application claims the benefit of Korean Patent Application No. P2005-105433, filed on Nov. 4, 2005, which is hereby incorporated by reference as if fully set forth herein.

BACKGROUND OF THE INVENTION

1. Field of the Invention

The present invention relates to a flash memory device, and more particularly, to a floating gate of a flash memory device and a method for fabricating the same, that improves the yield and quality of a product.

2. Discussion of the Related Art

Generally, the size of a floating gate for building-up electrons is a very important factor in the process of fabricating a flash memory device having a size of 0.18 µm or less.

As the integration of flash memory devices improve, it is necessary to decrease an interval between adjacent floating gates. However, it is difficult to form a fine pattern in the flash memory device with a recent photolithography process. To overcome these problems, the floating gates are formed with an oxide spacer structure and a hard mask using oxide.

Hereinafter, a method for fabricating a floating gate of a flash memory device according to the related art will be described with reference to the accompanying drawings.

FIGS. 1A to 1E are cross sectional views showing a method for fabricating a floating gate of a flash memory device according to the related art.

As shown in FIG. 1A, a tunneling oxide layer 12 is formed having a thickness between 80 Å and 120 Å on a semiconductor substrate 11. Then, a polysilicon layer for a floating gate 13a is formed having a thickness between 900 Å and 1100 Å on the tunneling oxide layer 12.

Referring to FIG. 1B, a first oxide layer 14 is formed at a thickness between 2000 Å and 2500 Å on the polysilicon layer 13a. After coating a photoresist 15 on the first oxide layer 14, the photoresist 15 is selectively patterned by exposure and development, thereby defining a floating gate area.

In this case, after coating the photoresist 15, an anti-reflection layer (not shown) may be formed having a thickness of about 600 Å on the photoresist 15.

Subsequently, the first oxide layer 14 is selectively patterned using the patterned photoresist 15 as a mask.

As shown in FIG. 1C, after removing the photoresist 15, a cleaning process is performed to remove residual substances of the photoresist 15 from the semiconductor substrate 11.

Then, a second oxide layer is formed on an entire surface of the semiconductor substrate 11 including the first oxide layer 14, wherein the second oxide layer is formed at a thickness between 650 Å and 850 Å. After that, an etching-back process is applied to the entire surface of the second oxide layer. Accordingly, second oxide sidewalls 16 are formed at both sides of the first oxide layer 14.

As shown in FIG. 1D, the polysilicon layer 13a is selectively etched using the first oxide layer 14 and the second oxide sidewalls 16 as a mask, thereby forming a floating gate 13.

At this time, the floating gate 13 is larger in width than the floating gate area defined by the patterned photoresist 15.

As shown in FIG. 1E, the first oxide layer 14 and the second oxide sidewalls 16 are removed by wet-etching.

In the meantime, if spacers are patterned below 100 nm with the photoresist pattern provided on the polysilicon layer 13a, it is unnecessary to provide the hard mask process. However, it is difficult to form the fine pattern below 100 nm with the recent photo process. Accordingly, the fine pattern of 100 nm or less is formed with the hard mask such as the oxide layer.

After that, the oxide layer for the hard mask is removed by the wet-etching process. At this time, the yield is lowered and the quality of product is deteriorated due to many defects generated when performing the wet-etching process.

SUMMARY OF THE INVENTION

Accordingly, the present invention is directed to a flash memory device and a method for fabricating the same that substantially obviates one or more problems due to limitations and disadvantages of the related art.

An object of the present invention is to provide a flash memory device and a method for fabricating the same, which has a floating gate formed with byproduct generated in an etching process, for example, polymer, and minimizes unstableness caused by a direct contact between the polymer and polysilicon for the floating gate, to improve the yield and the quality of product.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a flash memory device includes a semiconductor substrate; a floating gate formed on the semiconductor substrate; recessed parts formed on both corners of the floating gate; an insulating interlayer formed on an entire surface of the semiconductor substrate including the floating gate; and a control gate formed on the insulating interlayer.

In another aspect of the present invention, a flash memory device includes a semiconductor substrate; a floating gate formed on the semiconductor substrate; thermal oxide layers formed on both corners of the floating gate; an insulating interlayer on an entire surface of the semiconductor substrate including the floating gate; and a control gate formed on the insulating interlayer.

In another aspect of the present invention, a method for fabricating a flash memory device includes steps of sequentially forming a tunneling oxide layer, a conductive layer and an insulating layer on a semiconductor substrate; forming a photoresist pattern for defining a floating gate area on the insulating layer; selectively removing the insulating layer using the photoresist pattern as a mask; forming thermal oxide layers on a surface of the conductive layer from which the insulating layer is removed; forming polymer materials at both sides of the respective photoresist pattern and insulating layer; and forming a floating gate by selectively removing the thermal oxide layer and the conductive layer using the photoresist and the polymer materials as a mask.

Further, the method includes steps of removing the photoresist pattern, the insulating layer, the thermal oxide layer and the polymer materials; forming an insulating interlayer on the entire surface of the semiconductor substrate including the floating gate; and forming a control gate on the insulating interlayer.

In addition, the method includes steps of removing the photoresist pattern, the insulating layer and the polymer materials; forming an insulating interlayer on the entire surface of the semiconductor substrate including the thermal oxide layer and the floating gate; and forming a control gate on the insulating interlayer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate exemplary embodiment(s) of the invention and together with the description serve to explain the principle of the invention. In the drawings.

DETAILED DESCRIPTION OF THE ILLUSTRATED EMBODIMENTS

Reference will now be made in detail to the exemplary embodiments of the present invention, which are illustrated in the accompanying drawings. Wherever possible, the same reference numbers will be used throughout the drawings to refer to the same or like parts.

Hereinafter, a flash memory device and a method for fabricating the same according to the present invention will be described with reference to the accompanying drawings.

FIGS. 2A to 2G are cross sectional views showing a method for fabricating a flash memory device according to the present invention.

Figure 1A:
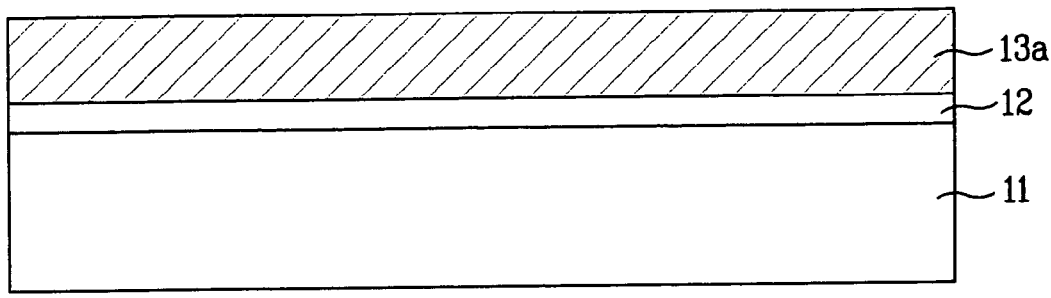
FIGS. 1A, 1B, 1C, 1D, and 1E are cross sectional views showing a floating gate of a flash memory device fabricated by a method according to the related art.
Figure 1B:
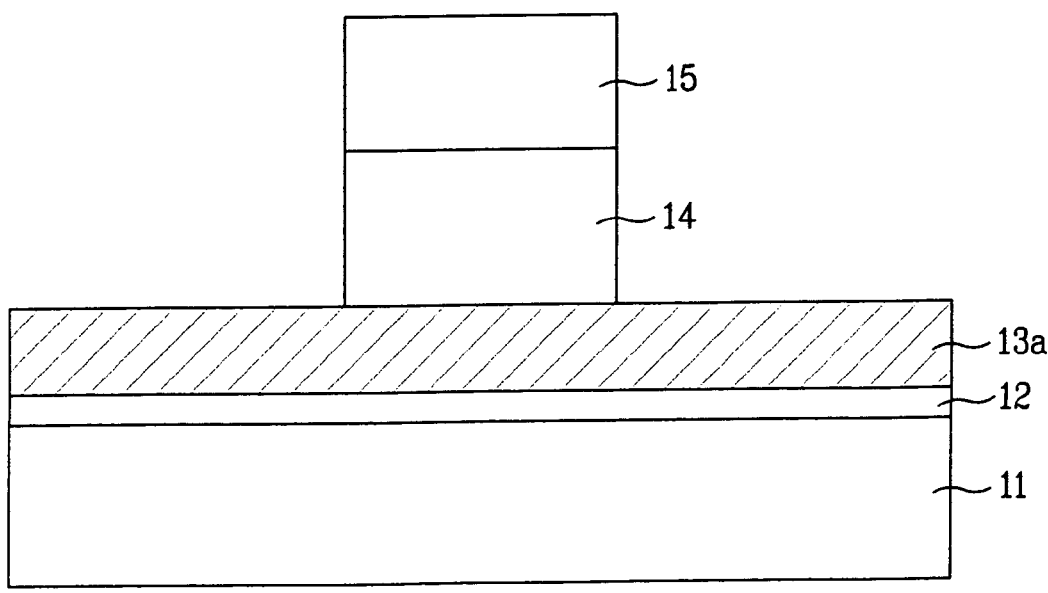
Figure 1C:
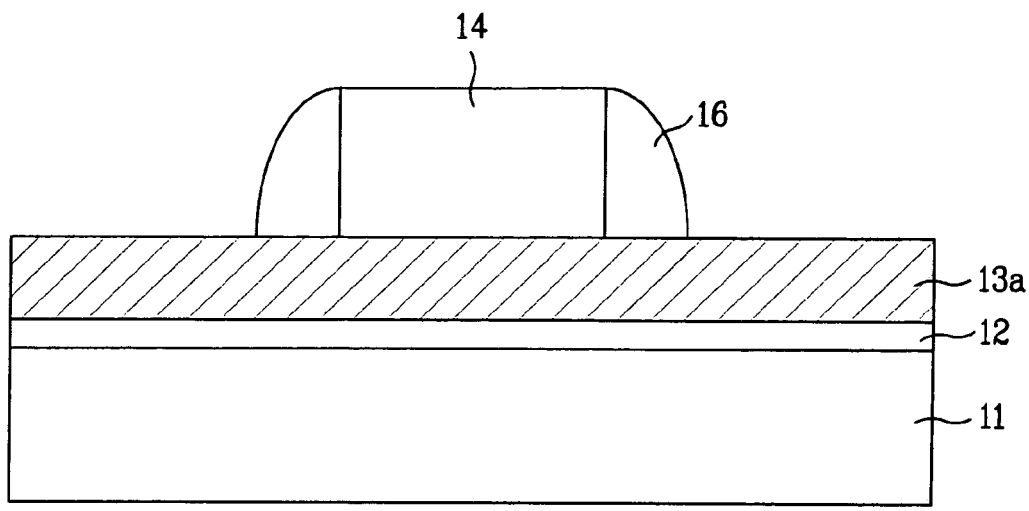
Figure 1D:
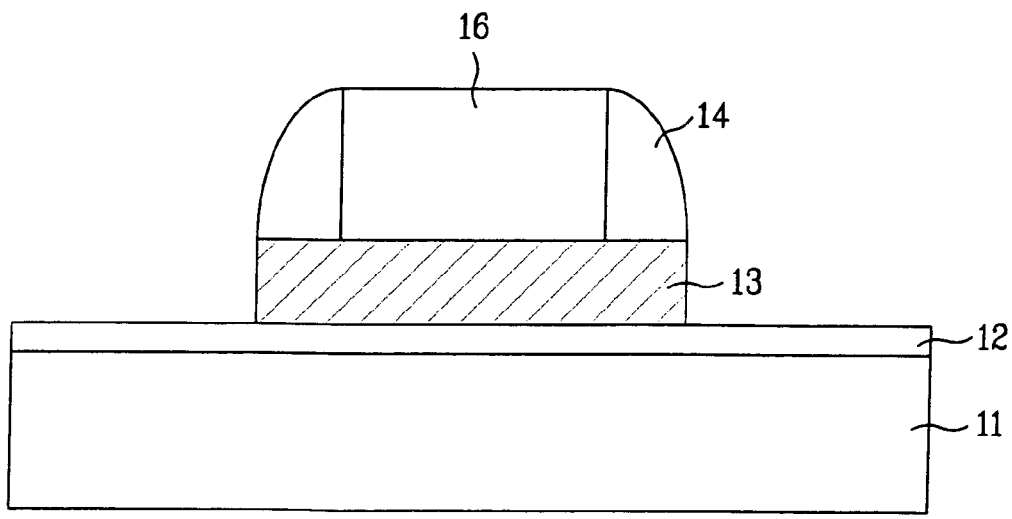
Figure 1E:
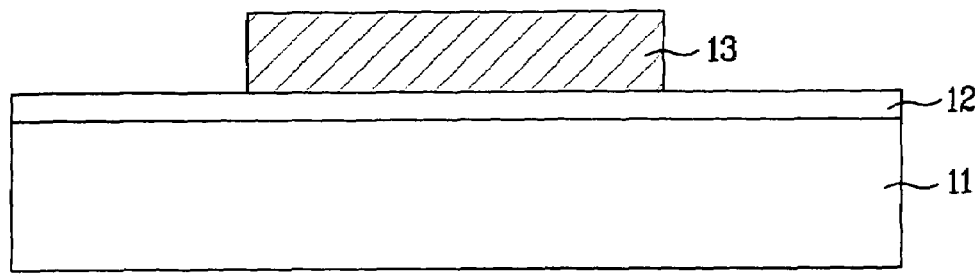
Figure 2A:
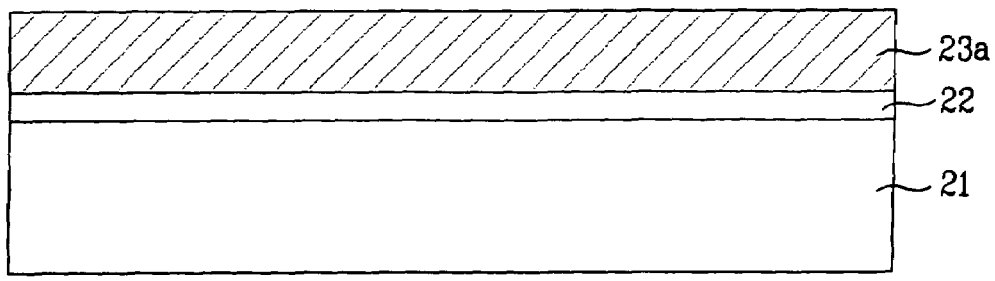
FIGS. 2A, 2B, 2C, 2D, 2E, 2F, and 2G are cross sectional views showing a flash memory device fabricated by a method according to exemplary embodiments of the present invention.

As shown in FIG. 2A, a tunneling oxide layer 22 is formed having a thickness between 80 Å and 120 Å on a semiconductor substrate 21. Then, a polysilicon layer 23a for a floating gate is formed having a thickness between 900 Å and 1100 Å on the tunneling oxide layer 22.

Figure 2B:
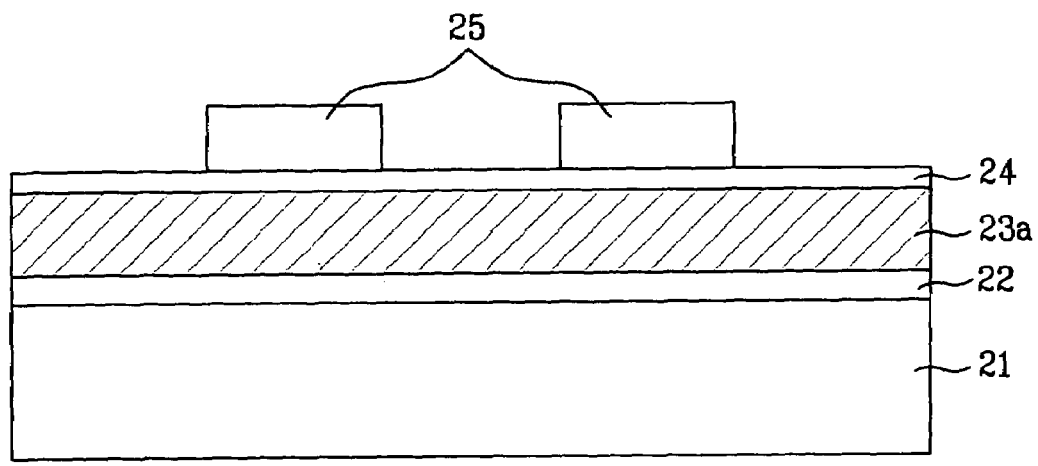

Referring to FIG. 2B, an insulating layer (BARC: Bottom Anti-Reflection Coating) 24 and a photoresist 25 are sequentially coated on an entire surface of the semiconductor substrate 21 including the polysilicon layer 23a.

At this time, the photoresist 25 may be formed by a spin coating method, a spray coating method, or a dip coating method. The spin coating method is advantageous in that it is configured to provide uniformity and stability. In the spin coating method, a wafer is maintained under a vacuum and is then rotated at a high speed.

After coating the photoresist 25, an anti-reflection layer (not shown) may be formed having a thickness of about 600 Å on the photoresist 25.

Next, a photo-mask (not shown) having a desired pattern is provided over the photoresist 25. Then, an exposure and development process is performed for patterning the photoresist 25. That is, the photoresist 25 is selectively patterned by exposure and development, thereby defining a floating gate area.

At this time, the development process may be performed by deposition or spray. In case of the development process by deposition, it is difficult to control the changes of temperature, density, and aging. However, in the development process by spray, it is easy to control the changes of temperature, density and aging. Recently, an in-line device using the spray method is widely used.

Figure 2C:
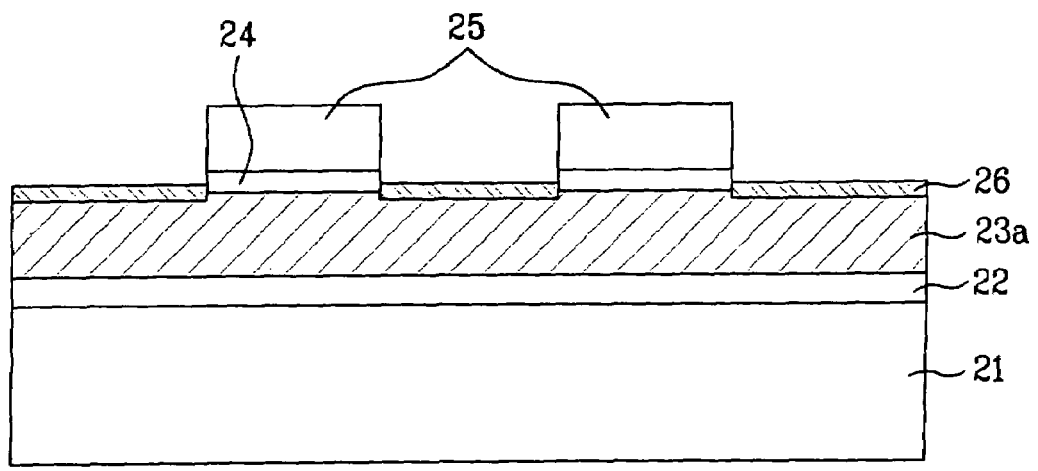

As shown in FIG. 2C, the insulating layer 24 is selectively etched using the patterned photoresist 25 as a mask. As a result, the polysilicon layer 23a except the portion corresponding to the patterned photoresist 25 is exposed.

Then, a thermal oxide layer 26 is formed by thermal-oxidizing the surface of the exposed polysilicon layer 23a. The thermal oxide layer 26 prevents the unstableness of the polysilicon layer 23a generated when the polysilicon layer 23a is in direct contact with a polymer material.

Figure 2D:
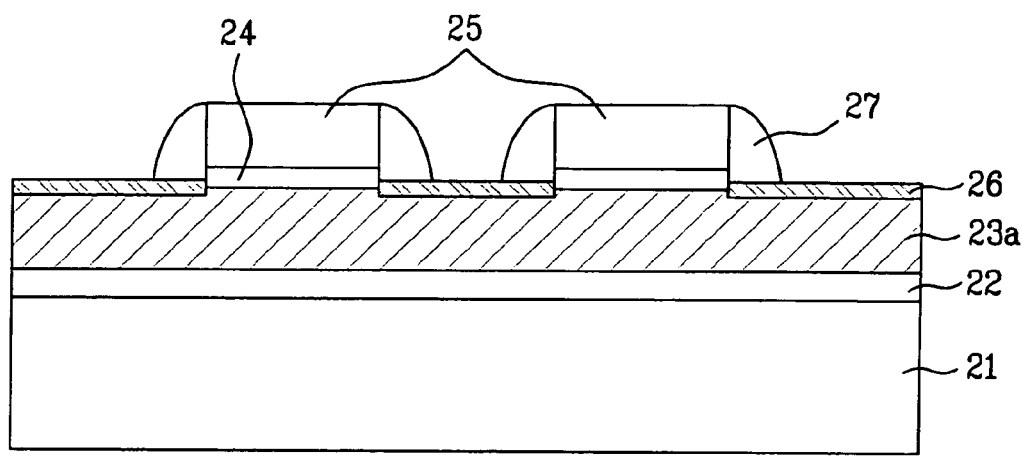

As shown in FIG. 2D, the polymer materials 27 are formed at both sides of the respective photoresist 25 and insulating layer 24.

At this time, the polymer materials 27 are formed by generating plasma with fluorine gases including carbon such as $CH_2F_2$ or $C_4F_8/C_5F_8$.

Figure 2E:
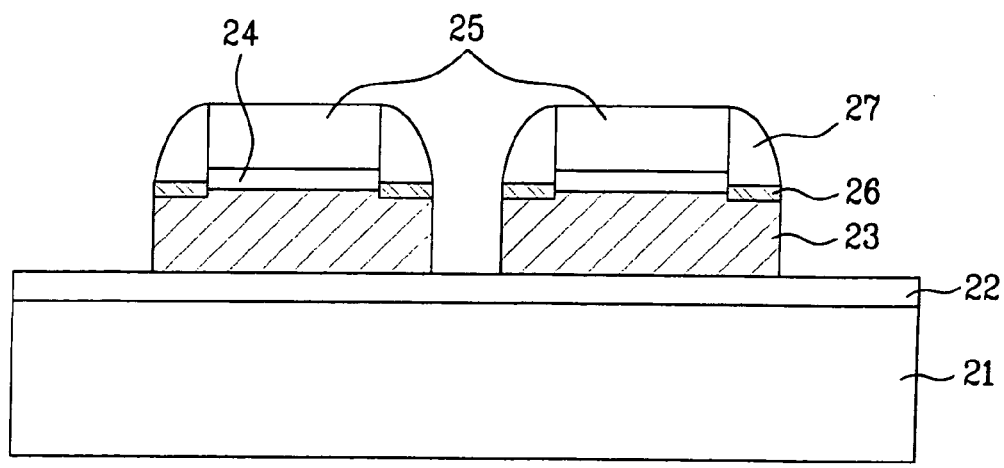

As shown in FIG. 2E, the thermal oxide layer 26 and the polysilicon layer 23a are etched with plasma using the photoresist 25 and the polymer materials 27 as a mask to form the floating gate 23.

At this time, the polysilicon layer 23a is dry-etched with HBr gases using a high selection ratio of the polysilicon layer 23a to the photoresist 25 and the polymer materials 27.

Figure 2F:
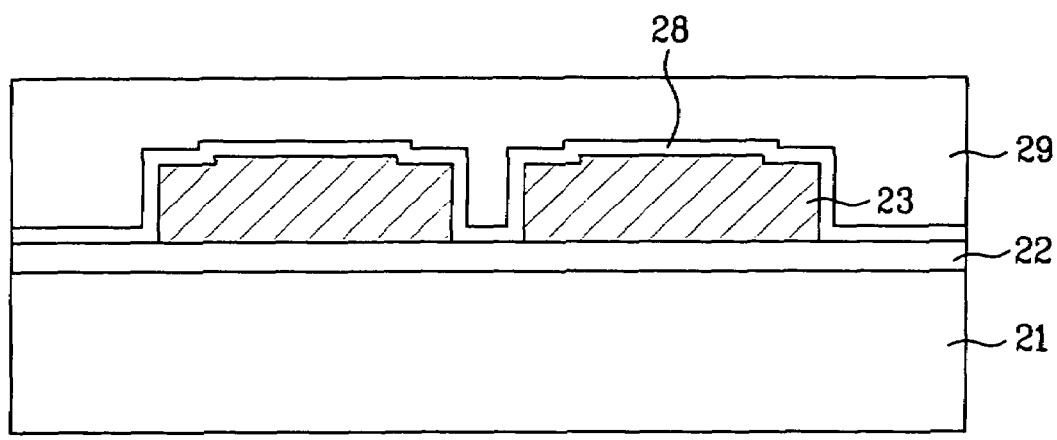

As shown in FIG. 2F, an oxygen $O_2$ ashing and cleaning process is applied to remove the insulating layer 24, the photoresist 25, the polymer materials 27 and the thermal oxide layer 26 from the semiconductor substrate 21. Then, an insulating interlayer 28 and a control gate line 29 are formed on the substrate 21 including the floating gate 23. Accordingly, since the thermal oxide layer is removed, recessed parts are formed at corners of the floating gate 23.

When removing the photoresist 24 used as the mask after forming the floating gate 23, an oxygen gas plasma method and a method of using various oxidizers may be used.

In the oxygen gas plasma method, the oxygen gas is provided under the vacuum and high-voltage state, whereby the oxygen gas plasma generates. The generated oxygen gas plasma reacts with the photoresist. As a result, the photoresist is removed by resolution.

For resolution of the photoresist, hot concentrated sulfuric acid or a mixture of hot concentrated sulfuric acid and hydrogen peroxide may be used as the oxidizer.

Figure 2G:
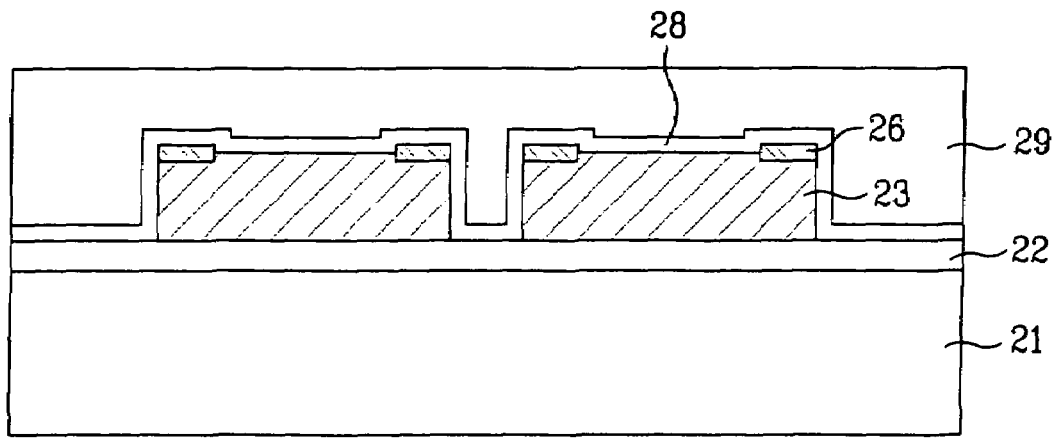

Also, in another method, as shown in FIG. 2G, the insulating layer 24, the photoresist 25 and the polymer materials 27 except the thermal oxide layer 26 may be removed by the oxygen $O_2$ ashing and cleaning process in FIG. 2E. The insulating interlayer 28 and the control gate line 29 are formed on the substrate 21 including the floating gate 23 and the thermal oxide layer 26, to form the flash memory device.

As mentioned above, the flash memory device and the method for fabricating the same according to the present invention has the following advantages.

First, the floating gate is formed by selectively etching the polysilicon layer with the byproduct, such as the polymer generated in the etching process, thereby improving the yield.

The flash memory device is fabricated with simplified steps, thereby decreasing the production cost.

Also, the thermal oxide layer is formed so that the polysilicon layer for the floating gate is not in direct contact with the polymer. As a result, it is possible to prevent the unstableness of the floating gate.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A flash memory device comprising:
   a semiconductor substrate;
   a floating gate formed on the semiconductor substrate and having recessed parts on outer edges of an upper surface of the floating gate, the recessed parts having a depth;
   thermal oxide layers formed on the recessed parts of the floating gate, the thermal oxide layers having a height which is greater than the depth of the recessed parts;
   an insulating interlayer formed on an entire surface of the semiconductor substrate including the floating gate and the thermal oxide layers;
   recessed parts formed on a center of an upper surface of the insulating interlayer, wherein the recessed parts are not overlapped with the thermal oxide layers; and
   a control gate formed on the insulating interlayer.

2. The flash memory device according to claim 1, further comprising a tunneling oxide layer between the floating gate and the semiconductor substrate.

* * * * *